(12) United States Patent
Ito et al.

(10) Patent No.: US 8,872,562 B2
(45) Date of Patent: Oct. 28, 2014

(54) SEMICONDUCTOR DEVICE

(71) Applicant: Kabushiki Kaisha Toshiba, Tokyo (JP)

(72) Inventors: Mikihiko Ito, Tokyo (JP); Masaru Koyanagi, Tokyo (JP); Masami Masuda, Chigasaki (JP); Maya Inagaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/020,705

(22) Filed: Sep. 6, 2013

(65) Prior Publication Data

US 2014/0285247 A1   Sep. 25, 2014

(30) Foreign Application Priority Data

Mar. 21, 2013 (JP) .................................. 2013-058940
Mar. 21, 2013 (JP) .................................. 2013-059026

(51) Int. Cl.
*H03K 5/04* (2006.01)
*H03K 5/12* (2006.01)

(52) U.S. Cl.
CPC ........................................ *H03K 5/12* (2013.01)
USPC ............................................ 327/175; 327/172

(58) Field of Classification Search
USPC ....................................... 327/31, 35, 170–175
See application file for complete search history.

(56) References Cited

U.S. PATENT DOCUMENTS

| | | | |
|---|---|---|---|
| 5,032,797 A | 7/1991 | Mijuskovic | |
| 6,643,790 B1 * | 11/2003 | Yu et al. | 713/500 |
| 7,965,118 B2 * | 6/2011 | Seefeldt | 327/175 |
| 2002/0027828 A1 | 3/2002 | Ikeda | |
| 2006/0044874 A1 | 3/2006 | Tokiwa | |
| 2007/0152752 A1 | 7/2007 | Oishi | |
| 2012/0025865 A1 | 2/2012 | Shimizu | |

FOREIGN PATENT DOCUMENTS

| | | |
|---|---|---|
| JP | 11-150427 A | 6/1999 |
| JP | 2011-229225 A | 11/2011 |
| JP | 2012-085200 A | 4/2012 |

* cited by examiner

*Primary Examiner* — An Luu
(74) *Attorney, Agent, or Firm* — Holtz, Holtz, Goodman & Chick PC (57) ABSTRACT

According to one embodiment, a semiconductor device includes a first differential amplifier and a second differential amplifier. The first differential amplifier charges the first output terminal with a second voltage different from a first voltage. The first differential amplifier uses a first clock signal, stopping the charging at the first output terminal, receives first complementary data of the first voltage at the rising edge of a second clock signal, and outputs the first complementary data at the second voltage. The second differential amplifier charges the second output terminal with the second voltage. The second differential amplifier uses a third clock signal, stopping the charging at the second output terminal, receives second complementary data of the first voltage at the rising edge of a fourth clock signal, and outputs the second complementary data at the second voltage.

12 Claims, 7 Drawing Sheets

SEMICONDUCTOR DEVICE

CROSS-REFERENCE TO RELATED APPLICATIONS

This application is based upon and claims the benefit of priority from Japanese Patent Applications No. 2013-058940, filed Mar. 21, 2013; and No. 2013-059026, filed Mar. 21, 2013, the entire contents of all of which are incorporated herein by reference.

FIELD

Embodiments described herein relate generally to a semiconductor device able to operate at high speeds, more particularly to a data output circuit for use in the semiconductor device.

BACKGROUND

In a semiconductor device such as a dynamic RAM or a NAND flash memory, it is desired that the clock signal should have a duty ratio of 50% in order to output data at high speed, i.e., double data rate (DDR) in accordance with the clock signal. If the duty ratio deviates from 50%, a sufficient margin can hardly be acquired, and the data cannot be correctly output easily.

DETAILED DESCRIPTION

In general, according to one embodiment, a semiconductor device includes a first differential amplifier and a second differential amplifier. The first differential amplifier charges the first output terminal with a second voltage different from a first voltage. The first differential amplifier uses a first clock signal, stopping the charging at the first output terminal, receives first complementary data of the first voltage at the rising edge of a second clock signal, and outputs the first complementary data at the second voltage from the first output terminal. The second differential amplifier charges the second output terminal with the second voltage. The second differential amplifier uses a third clock signal, stopping the charging at the second output terminal, receives second complementary data of the first voltage at the falling edge of a fourth clock signal, and outputs the second complementary data at the second voltage from the second output terminal.

In most data output circuits configured to output data at DDR (i.e., high speed), complementary clock signals REOLATe and REOLATo that determine the timing of outputting data are supplied via a phase splitter to a clocked inverter circuit. The phase splitter adds a phase shift to the complementary clock signals REOLATe and REOLATo. Since the complementary clock signals REOLATe and REOLATo are independent of each other, a phase difference between them, if any resulting from, for example, line delay cannot be corrected. Further, since the clocked inverter circuit receives the output data, high data is output at one through rate, and low data is output at another through rate. Still further, the data output from the clocked inverter circuit is supplied to an output driver transistor through a level shifter, the level shifter changes or skews the duty ratio of the data, inevitably degrading the characteristic of the data output circuit.

Embodiments will be described hereinafter with reference to the accompanying drawings.

First Embodiment

Figure 1:
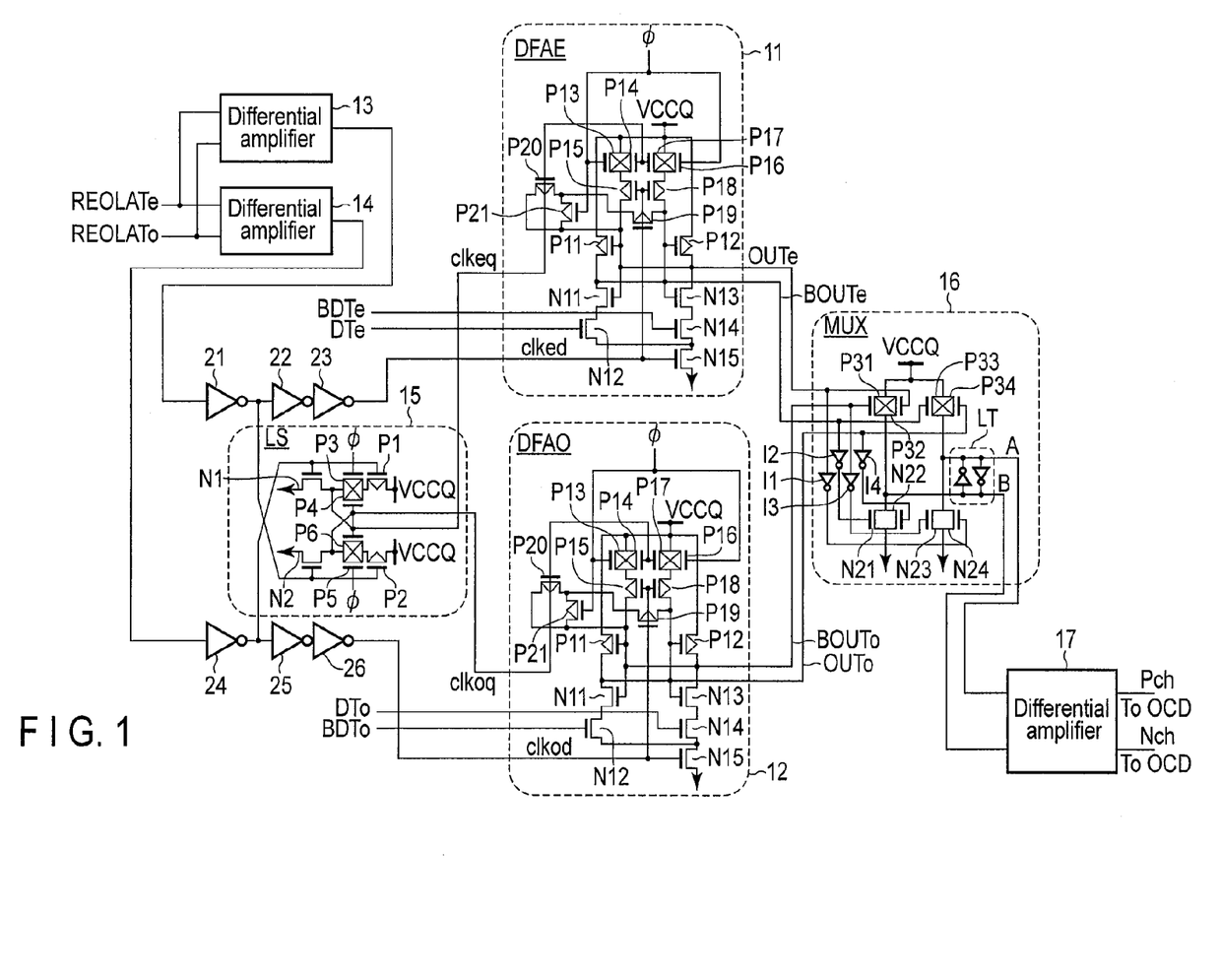
FIG. 1 is a circuit diagram showing a semiconductor device according to a first embodiment.

FIG. 1 shows a data output circuit according to a first embodiment, which is configured to output data at DDR.
(Configuration)

The data output circuit comprises a first differential amplifier 11, a second differential amplifier 12, a third differential amplifier 13, a fourth differential amplifier 14, a level converter 15, a multiplexer 16, and a fifth differential amplifier 17.

The third differential amplifier 13 and the fourth differential amplifier 14 receives a clock signal REOLATe and a clock signal REOLATo, respectively, as complementary signals. Clock signals REOLATe and REOLATo are signals of a first voltage, such as VDD-level signals.

The third differential amplifier 13 generates a clock signal from clock signals REOLATe and REOLATo. The clock signal is supplied, as a VDD-level clock signal clked, to the first differential amplifier 11 through inverter circuits 21, 22 and 23.

The fourth differential amplifier 14 generates a clock signal from clock signals REOLATe and REOLATo. This clock signal is supplied, as a VDD-level clock signal clkod, to the second differential amplifier 12 through inverter circuits 24, 25 and 26.

Clock signal clked and clock signal clkod are signals complementary to each other.
(Level Convert)

The output terminals of inverter circuits 21 and 24 are connected to the level converter 15. The level converter 15 converts a VDD-level clock signal to a clock signal of second voltage, for example, VCCQ level different from VDD level. That is, VCCQ level is may be higher than the VDD level in one case, or may be lower than the VDD level in another case.

The level converter 15 comprises a plurality of P-channel MOS transistors (hereinafter called "PMOS transistors") P1 to P6 and a plurality of N-channel MOS transistors (hereinafter called "NMOS transistors") N1 and N2. The current paths of PMOS transistors P1 and P2 are connected, at one end, to two nodes, respectively, to which power-supply voltage VCCQ is applied.

The other end of the current path of PMOS transistor P1 is grounded by PMOS transistors P3 and P4 connected in parallel and by an NMOS transistor N1. The gates of PMOS transistor P1 and NMOS transistor N1 are connected to the output terminal of inverter circuit 24.

The other end of the current path of PMOS transistor P2 is grounded by PMOS transistors P5 and P6 connected in parallel and by an NMOS transistor N2. The gates of PMOS transistor P2 and NMOS transistor N2 are connected to the output terminal of inverter circuit 21.

The gates of PMOS transistor P3 and t P5 receive a signal Φ. The signal Φ is at 0 V if the power-supply voltage VCCQ is, for example, 1.8 V and is 3.3 V if the power-supply voltage VCCQ is 3.3 V.

The gate of PMOS transistor P6 is connected to the connection node of PMOS transistors P3 and P4. From the connection node, a VCCQ-level clock signal clkeq is output and supplied to the first differential amplifier 11.

The gate of PMOS transistor P4 is connected to NMOS transistor N2 and to the connection node of PMOS transistors P5 and P6. From this connection node, a VCCQ-level clock signal clkoq is output. The VCCQ-level clock signal clkoq is supplied to the second differential amplifier 12.

The VCCQ-level clock signal clkeq and the VCCQ-level clock signal clkoq are signals complementary to each other.

The first differential amplifier 11 and the second differential amplifier 12 are identical in configuration. Therefore, the configuration of only the first differential amplifier 11 will be described. The components of the second differential amplifier 12, which are identical to those of the first differential amplifier 11, will be designated by the same reference numbers.

(First Differential Amplifier)

The first differential amplifier 11 comprises PMOS transistors P11 to P21 and NMOS transistors N11 to N15. PMOS transistors P11 to P21 configure a pre-charge circuit for output nodes OUTe and BOUTe.

The current path of PMOS transistor P11 is connected, at one end, to a node to which the power-supply voltage VCCQ is applied. The other end of the current path of PMOS transistor P11 is grounded by NMOS transistors N11, N12 and N15.

The current path of PMOS transistor P12 is connected, at one end, to a node to which the power-supply voltage VCCQ is applied. The other end of the current path of PMOS transistor P12 is grounded by NMOS transistors N13, N14 and N15.

Data DTe and data BDTe which are complementary to each other are supplied to the gates of NMOS transistors N12 and N14, respectively.

The current paths of PMOS transistors P13 and P14 connected in parallel to each other are connected, at one end, to the node to which the power-supply voltage VCCQ is applied. The other ends of PMOS transistors P13 and P14 are connected by PMOS transistor P15 to the gate of PMOS transistor P11 and the gate of NMOS transistor N11.

The current paths of PMOS transistors P16 and P17 connected in parallel are connected, at one end, to a node to which the power-supply voltage VCCQ is applied.

PMOS transistors P16 and P17 are connected, at the other end, by PMOS transistor P18, respectively to the gate of PMOS transistor P12 and the gate of NMOS transistor N13.

PMOS transistors P19 and P20 are connected in series between the gate of PMOS transistor P12 and the gate of PMOS transistor P11. PMOS transistor P21 is connected between the connection node of PMOS transistors P19 and P20 and the gate of PMOS transistor 11.

The connection node of PMOS transistor P12 and NMOS transistor N13 is output terminal OUTe of the first differential amplifier 11. The connection node is connected to the gate of PMOS transistor P11 and to the gate of NMOS transistor N11.

The connection node of PMOS transistor P11 and NMOS transistor N11 is the inverting output terminal BOUTe of the first differential amplifier 11. This connection node is connected to the gate of PMOS transistor P12 and to the gate of NMOS transistor N13.

A signal Φ is supplied to the gates of PMOS transistors P13, P16 and P21.

A clock signal clkeq output from the level converter 15 is supplied to the gates of PMOS transistors P14, P17 and P20.

A clock signal clked is supplied to the gate of NMOS transistor N15 and to the gates of PMOS transistors P15, P18 and P19.

(Second Differential Amplifier)

In the second differential amplifier 12, clock signal clkoq is supplied to the gates of PMOS transistors P14, P17 and P20. Clock signal clkod is supplied to the gate of NMOS transistor N15 and to the gates of PMOS transistors P15, P18 and P19. Data DTo is supplied to the gate of NMOS transistor N14. Data BDTo is supplied to the gate of NMOS transistor N12.

The connection node of PMOS transistor P11 and NMOS transistor N11 is output terminal OUTo of the second differential amplifier 12. The connection node is connected to the gate of PMOS transistor 12 and to the gate of NMOS transistor N13.

The connection node PMOS transistor P12 and NMOS transistor N13 is the inverting output terminal BOUTo of the second differential amplifier 12. This connection node is connected to the gate of PMOS transistor 11 and to the gate of NMOS transistor N11.

(Multiplexer)

The multiplexer 16 comprises a plurality of inverter circuits I1 to I4, PMOS transistors P31 to P34 configuring a transfer gate, NMOS transistors N21 to N24, and a latch circuit LT.

PMOS transistors P31 and P32 connected in parallel, and NMOS transistors N21 and N22 connected in parallel are connected in series between ground and a node to which the power-supply voltage VCCQ is applied. Further, PMOS transistors P33 and P34 connected in parallel, and NMOS transistors N23 and N24 are connected in parallel are connected in series between ground and the node to which the power-supply voltage VCCQ is applied.

Output node OUTe of the first differential amplifier is connected to the gate of PMOS transistor P32, and also to the gate of NMOS transistor N24 by inverter circuit I1.

Output node BOUTe of the first differential amplifier is connected to the gate of PMOS transistor P33, and also to the gate of NMOS transistor N21 by inverter circuit I2.

Output node BOUTo of the second differential amplifier is connected to the gate of PMOS transistor P31, and also to the gate of NMOS transistor N23 by inverter circuit I3.

Output node OUTo of the second differential amplifier is connected to the gate of PMOS transistor P34, and also to the gate of NMOS transistor N22 by inverter circuit I4.

The connection node of PMOS transistors P33 and P34 and NMOS transistors N23 and N24 is first output terminal A of the multiplexer 16. The connection node of PMOS transistors P31 and P32 and NMOS transistors N21 and N22 is second output terminal B of the multiplexer 16. Latch circuit LT is connected between the first output terminal A and the second output terminal B.

Output terminals A and B of the multiplexer 16 are connected to the two input terminals of the differential amplifier 17. The two output terminals of the differential amplifier 17 are connected to a PMOS drive transistor (not shown) and an NMOS driver transistor (not shown), respectively.

(Operation)

How the first differential amplifier 11, second differential amplifier 12 and multiplexer 16 operate in the configuration described above will be explained with reference to FIG. 2.

Figure 2:
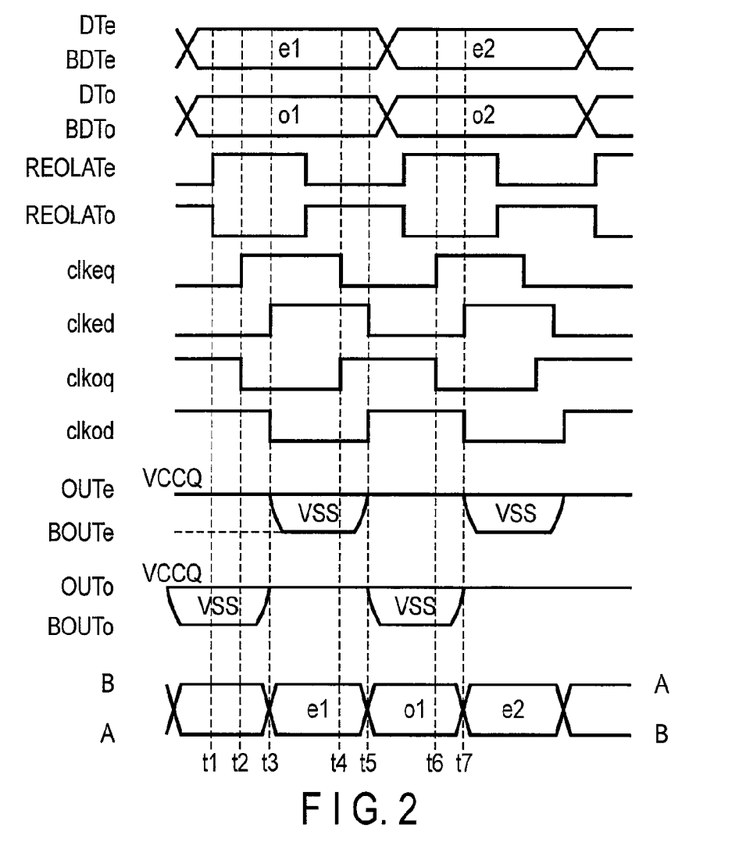
FIG. 2 is a timing chart showing how the device of FIG. 1 operates.

The first differential amplifier 11 outputs data DTe and BDTe (even-numbered data) in accordance with clock signals clkeq and clked. The second differential amplifier 12 outputs data DTo and BDTo (odd-numbered data) in accordance with clock signals clkoq and clkod.

Clock signals clkeq and clkoq are complementary to each other. Clock signals clked and clkod are complementary to each other. Clock signals clkeq and clked are of the same phase, and clock signal clked is delayed a little with respect to clock signal clkeq. Clock signals clkoq and clkod are of the same phase, and clock signal clkod is delayed a little with respect to clock signal clkoq.

As shown in FIG. 2, clock signals clkeq and clked are low at time t1. Therefore, PMOS transistors P14, P15, P17, P18, P19 and 20 are on in the first differential amplifier 11. Since NMOS transistor N15 is off, NMOS transistors N11 to N14 are off. As a result, output node OUTe is charged to the VCCQ level via PMOS transistors P13 and P15, and output node BOUTe is charged to the VCCQ level via PMOS transistors P17 and P18.

At this point, clock signals clkoq and clkod are high. PMOS transistors P14, P15, P17, P18, P19 and P20 are off and NMOS transistor N15 is on, in the second differential amplifier 12. PMOS transistors P11 and P12 and NMOS transistors N11, N12, N13 and N14 are driven by data signals DTo and BDTo that are complementary to each other. If data DTo and BDTo are high and low, respectively, PMOS transistor P11 and NMOS transistors N13 and N14 will be on, whereas PMOS transistor P12 and NMOS transistors N11 and N12 will be off. In this case, output terminals OUTo and BOUTo of the second differential amplifier 12 are high (VCCQ) and low (VSS), respectively.

Thereafter, at time t2, clock signal clkeq goes high. Then, PMOS transistors P14, P15, P17, P18, P19 and P20 are turned off in the first differential amplifier 11, stopping the charging at both output node OUTe and BOUTe.

At this point, clock signal clkoq is low. PMOS transistors P14, P15, P17, P18, P19 and P20 are turned on in the second differential amplifier 12, starting the charging at both output nodes OUTo and BOUTo.

Next, at time t3, clock signal clked goes high. NMOS transistor N15 is turned on in the first differential amplifier 11. At this point, data DTe is low, and data BDTe is high. NMOS transistor N12 is therefore turned off, and NMOS transistor N14 is turned on. Output terminal OUTe is therefore electrically discharged via NMOS transistors N13, N14 and N15, and is made low. As output terminal OUTe is made low, PMOS transistor P11 is turned on. Output terminal OUTe therefore is kept high.

At time t3, output terminals OUTo and BOUTo of the second differential amplifier 12 are held charged (high).

In the multiplexer 16, output terminal OUTe of the first differential amplifier 11 is low, output terminal BOUTe thereof is high, and output terminals OUTo and BOUTo of the second differential amplifier 12 are both high. Therefore, PMOS transistor P31 is off, PMOS transistor P32 is on, and NMOS transistors N21 and N22 are off. PMOS transistors P33 and P34 are off, NMOS transistor N23 is off, and NMOS transistor N24 is on. As a result, NMOS transistor N24 makes output terminal A of the multiplexer 16 low, and PMOS transistor P32 makes output terminal B of the multiplexer 16 high. This state is held by the latch circuit LT. That is, the latch circuit LT holds the even-numbered data "e1."

The data output from output terminals A and B of the multiplexer 16 is supplied to the differential amplifier 17. The differential amplifier 17 outputs a signal, which is supplied to a PMOS drive transistor (not shown) and a NMOS drive transistor (not shown).

(Time t4)

Next, at time t4, clock signal clkoq goes high. PMOS transistors P14, P15, P17, P18, P19 and P20 of the second differential amplifier 12 are therefore turned off, stopping the charging at output nodes OUTo and BOUTo.

At this point, clock signal clkeq goes low. PMOS transistors P14, P15, P17, P18, P19 and P20 of the first differential amplifier 11 are therefore turned on, starting the charging at output nodes OUTe and BOUTe.

(Time t5)

Then, at time t5, clock signal clkod goes high.

NMOS transistor N15 of the second differential amplifier 12 is therefore turned on. At this point, data DTo is low, and data BDTo is high. Therefore, NMOS transistor N14 is turned off and NMOS transistor N12 is turned on. Output terminal BOUTo of the second differential amplifier 12 therefore stays high, and the charge is released from output terminal OUTo via NMOS transistors N11, N12 and N15. Output terminal OUTo is thereby made low. At time t5, output terminals OUTe and BOUTe of the first differential amplifier 11 are held in a charged state (high).

In the multiplexer 16, PMOS transistors P31, P32 and P33 are off and PMOS transistor P34 is on, because output terminals OUTo of the second differential amplifier 12 is low, and output terminal BOUTo is high, whereas output terminals OUTe and BOUTe of the first differential amplifier 11 are high. Further, NMOS transistors N21, N23 and N24 are off, and NMOS transistor N22 is on in the multiplexer 16. Hence, output terminal A of the multiplexer 16 is made high by PMOS transistor P34, and output terminal B of the multiplexer 16 is made low by NMOS transistor N22. The latch circuit LT holds this state, holding odd-numbered data "o1."

The data output from output terminals A and B of the multiplexer 16 is supplied to the differential amplifier 17, which outputs a signal. This signal is supplied to the PMOS drive transistor (not shown) and to the NMOS drive transistor (not shown).

Advantages of the First Embodiment

In the first embodiment, the first differential amplifier 11 receives even-numbered complementary data DTe and BDTe at the rising edge of clock signal clked, and the second differential amplifier 12 receives odd-numbered complementary data DTo and BDTo at the rising edge of clock signal clkod. Thus, the first and second differential amplifiers 11 and 12 receive the even-numbered complementary data and the odd-numbered complementary data, respectively on the rising edges of clock signals clked and clkod. This can suppress not only the phase difference between the complementary data items, but also the phase difference between the even-numbered data and the odd-numbered data.

That is, if a data item is received at the rising edge of a clock signal and another data item is received at the falling edge of the clock signal, the rising edge and falling edge of the clock signal will be received by an NMOS transistor and a PMOS transistor, respectively. In this case, these data items may likely have a phase difference because the NMOS transistor and the PMOS transistor differ in current-driven ability.

By contrast, in this embodiment, clock signals clkeq, clked, clkoq and clkod are supplied to NMOS transistors of the first and second differential amplifiers 11 and 12. Hence, the NMOS transistors have the same current-driven ability (namely, a very small difference in current-driven ability). Therefore, a phase difference can hardly exist between the even-numbered data and the odd-numbered data.

Figure 3:
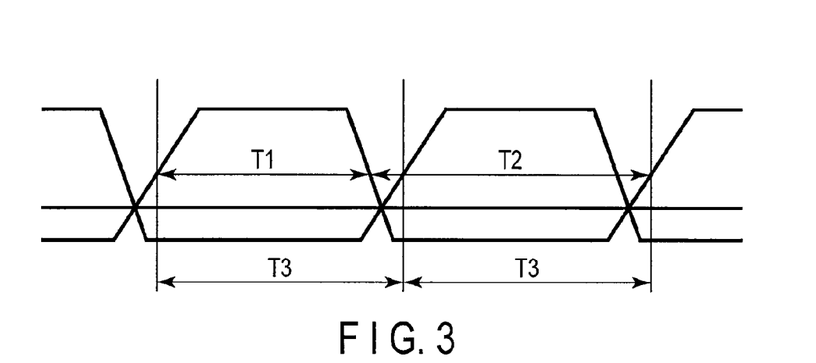
FIG. 3 is a waveform diagram explaining the advantage of the first embodiment.

In this embodiment, the first differential amplifier 11 receives the complementary data DTe and BDTe, and the second differential amplifier 12 receives the complementary data DTo and BDTo. The duty ratio of the output data can therefore be approximated to 50%. As seem from FIG. 3, an output circuit of ordinary type, for example, may acquire data at the intermediate level of the data signal. If so, the duty ratio of the data will not be 50% if the signal rises and falls with a delay, as indicated by lines T1 and T2 in FIG. 3. In this embodiment, the data is acquired at the rising edges of the complementary clock signals if the first and second differential amplifiers 11 and 12 receive the complementary data. Therefore, the duty ratio of the output data can approach 50% as indicated by line T3 in FIG. 3, even if the signal rises and falls with some delay. A sufficient margin can therefore be ensured in high-speed operation.

Further, in the first and second differential amplifiers 11 and 12, output terminals OUTe and BOUTe and output terminals OUTo and BOUTo are charged to VCCQ higher than VDD while clock signals clkeq and clkoq stay low. When clock signals clkeq and clkoq go high, the charging at output terminals OUTe and BOUTe and output terminals OUTo and BOUTo is stopped. At the rising edges of clock signals clked and clkod, the first and second differential amplifiers 11 and 12 receive VDD-level data DTe, BDTe, DTo, and BDTo, and output VCCQ-level data. Thus, the first and second differential amplifiers 11 and 12 have the function of a level shifter. This avoids such a phase difference between the complementary data items, as will occur if level shifters are used. If a level shifter except the differential amplifier is used, a phase difference between the complementary data items will occur.

Still further, clock signals REOLATe and REOLATo are supplied to the third differential amplifier 13, and also to the fourth differential amplifier 14. Therefore, the third and fourth differential amplifiers 13 and 14 can cancel the phase difference between clock signals REOLATe and REOLATo.

Second Embodiment

Figure 4:
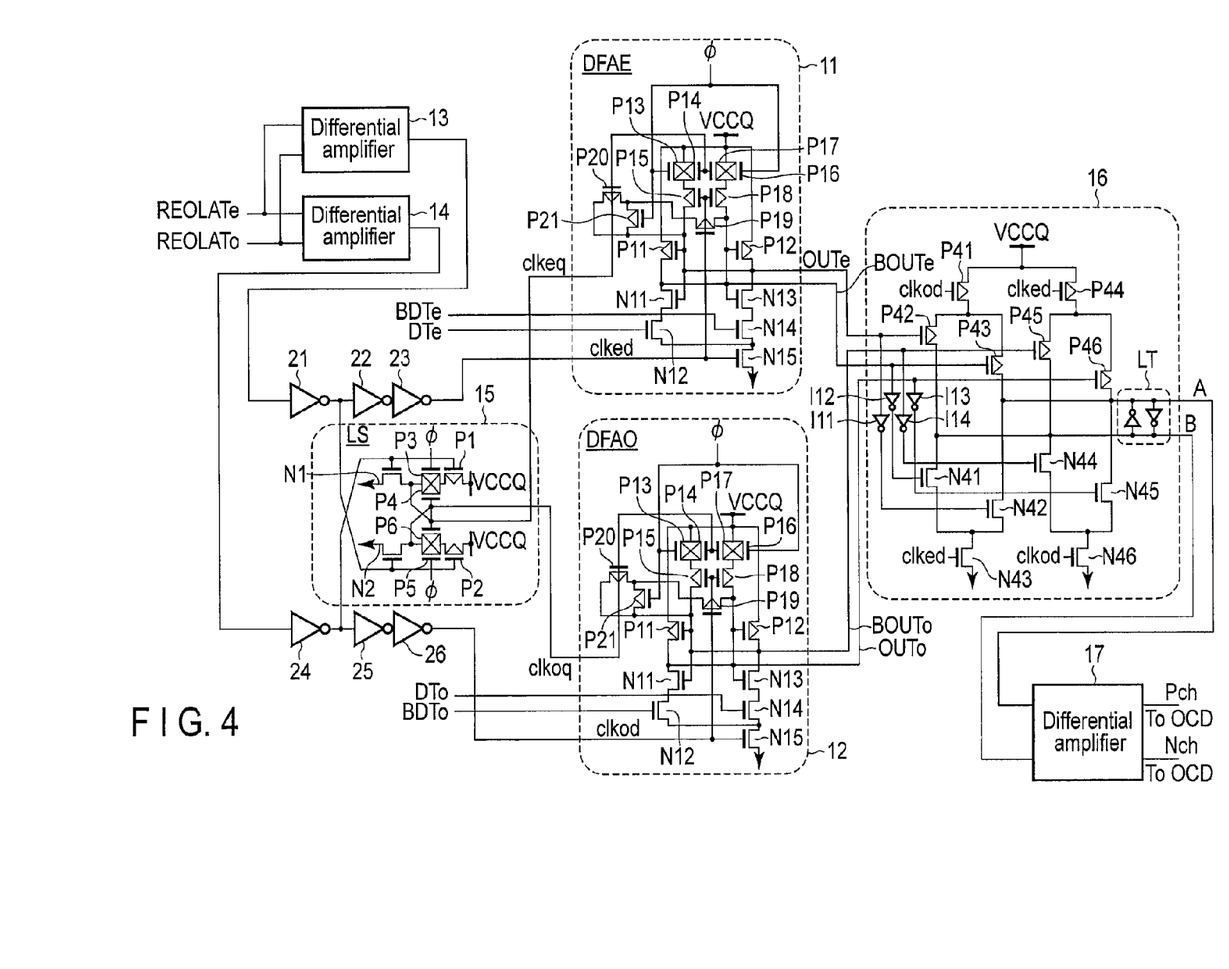
FIG. 4 is a circuit diagram showing a semiconductor device according to a second embodiment.

FIG. 4 shows the second embodiment. In FIG. 4, the components identical to those of the first embodiment are designated by the same reference numbers.

In the first embodiment described above, data is output from, for example, the first differential amplifier 11, output terminals OUTe and BOUTe of the first differential amplifier 11 are then electrically charged, and the data is output from the second differential amplifier 12. Due to, for example, the changes in manufacturing conditions, however, it may take much time to charge output terminals OUTe and BOUTe. In this case, the charging output terminals OUTe and BOUTe of the first differential amplifier 11 may interfere with the data outputting from the second differential amplifier 12. Some margin is required between the completion of charging and the outputting of complementary data.

In view of this, the time between the completion of charging and the outputting of the complementary data is shortened in the second embodiment, thereby to output data at a speed higher than otherwise.

The second embodiment differs from the first embodiment in the configuration of the multiplexer 16.

As shown in FIG. 4, the multiplexer 16 comprises PMOS transistors P41 to P46, NMOS transistors N41 to N46, inverter circuits I11 to I14, and a latch circuit LT.

The current path of PMOS transistor P41 is connected, at one end, to a node to which the power-supply voltage VCCQ is applied. To the gate of PMOS transistor P41, a clock signal clkod is supplied. The other end of PMOS transistor P41 is connected to one end of the series circuit composed of PMOS transistor P42 and NMOS transistor N41, and also to one end of the series circuit composed of PMOS transistor P43 and NMOS transistor N42. The other end of the series circuit composed of PMOS transistor P42 and NMOS transistor N41, and the other end of the series circuit composed of PMOS transistor P43 and NMOS transistor N42 are grounded by NMOS transistor N43. To the gate of NMOS transistor N43, a clock signal clked is supplied.

The current path of PMOS transistor P44 is connected, at one end, to the node to which the power-supply voltage VCCQ is applied. To the gate of PMOS transistor P44, a clock signal clked is supplied. The other end of PMOS transistor P44 is connected to one end of the series circuit composed of PMOS transistor P45 and NMOS transistor N44, and also to one end of the series circuit composed of PMOS transistor P46 and NMOS transistor N45. The other end of the series circuit composed of PMOS transistor P45 and NMOS transistor N44, and the other end of the series circuit composed of PMOS transistor P46 and NMOS transistor N45 are grounded by NMOS transistor N46. To the gate of NMOS transistor N46, a clock signal clkod is supplied.

The gate of PMOS transistor P42 is connected to output terminal OUTe of the first differential amplifier 11. The gate of PMOS transistor 43 is connected to output terminal BOUTe of the first differential amplifier 11. The gate of PMOS transistor P45 is connected to output terminal BOUTo of the second differential amplifier 12. The gate of PMOS transistor 46 is connected to output terminal OUTo of the second differential amplifier 12.

The gate of NMOS transistor N41 is connected by an inverter circuit I12 to output terminal BOUTe of the first differential amplifier 11. The gate of NMOS transistor N42 is connected by an inverter circuit I11 to output terminal OUTe of the first differential amplifier 11. The gate of NMOS transistor N44 is connected by an inverter circuit I14 to output terminal BOUTo of the second differential amplifier 12. The gate of NMOS transistor N45 is connected by an inverter circuit I13 to output terminal OUTo of the second differential amplifier 12.

The latch circuit LT is connected, at one end, to the connection node of PMOS transistor P43 and NMOS transistor N42, and also to the connection node of PMOS transistor P46 and NMOS transistor N45. The other end of the latch circuit LT is connected to the connection node of PMOS transistor P42 and NMOS transistor N41, and also to the connection node of PMOS transistor P45 and NMOS transistor N44.

The first output terminal A and second output terminal B of the multiplexer 16 are connected to two input terminals of a differential amplifier 17. The two output terminals of the differential amplifier 17 are connected to a PMOS drive transistor (not shown) and an NMOS transistor (not shown), respectively.

How the configuration described above operates will be explained below.

In the multiplexer 16, clock signal clkod goes high and clock signal clked goes low, to receive odd-numbered complementary data from, for example, the second differential amplifier 12. As a result, PMOS transistor P41 and NMOS transistor N43 are turned off, whereas PMOS transistor P44 and NMOS transistor N46 are turned on. Therefore, Outputs terminals OUTe and BOUTe of the first differential amplifier 11 are not selected, and the latch circuit LT latches the odd-numbered complementary data output from output terminals OUTo and BOUTo of the second differential amplifier 12.

To output the even-numbered complementary data from, for example, the first differential amplifier 11, clock signal clkod goes low, and clock signal clked goes high. Therefore, PMOS transistor P44 and NMOS transistor N46 are turned off, whereas PMOS transistor P41 and NMOS transistor N43 are turned on. Hence, output terminals OUTo and BOUTo of the second differential amplifier 12 are not selected, the latch circuit LT latches the even-numbered complementary data output from output terminals OUTe and BOUTe of the first differential amplifier 11.

In the second embodiment, the multiplexer 16 does not select output terminal OUTo or BOUTo of the second differential amplifier 12, in accordance with clock signals clked and clkod, in order to output data from the first differential amplifier 11, and do not select output terminal OUTe or BOUTe of the first differential amplifier 11 in order to output data from the second differential amplifier 12. This can prevent the data output from the multiplexer 16 from being interfered due to a delay of charging, even if the charging time differs between the first and second differential amplifiers 11 and 12. Hence, the shift of the duty ratio can be more suppressed than otherwise, and no margin need be set between the completion of charging and the outputting of data. Thus, the data can be output at high speed.

Third Embodiment (Third and Fourth Differential Amplifiers 13 and 14)

Figure 5:
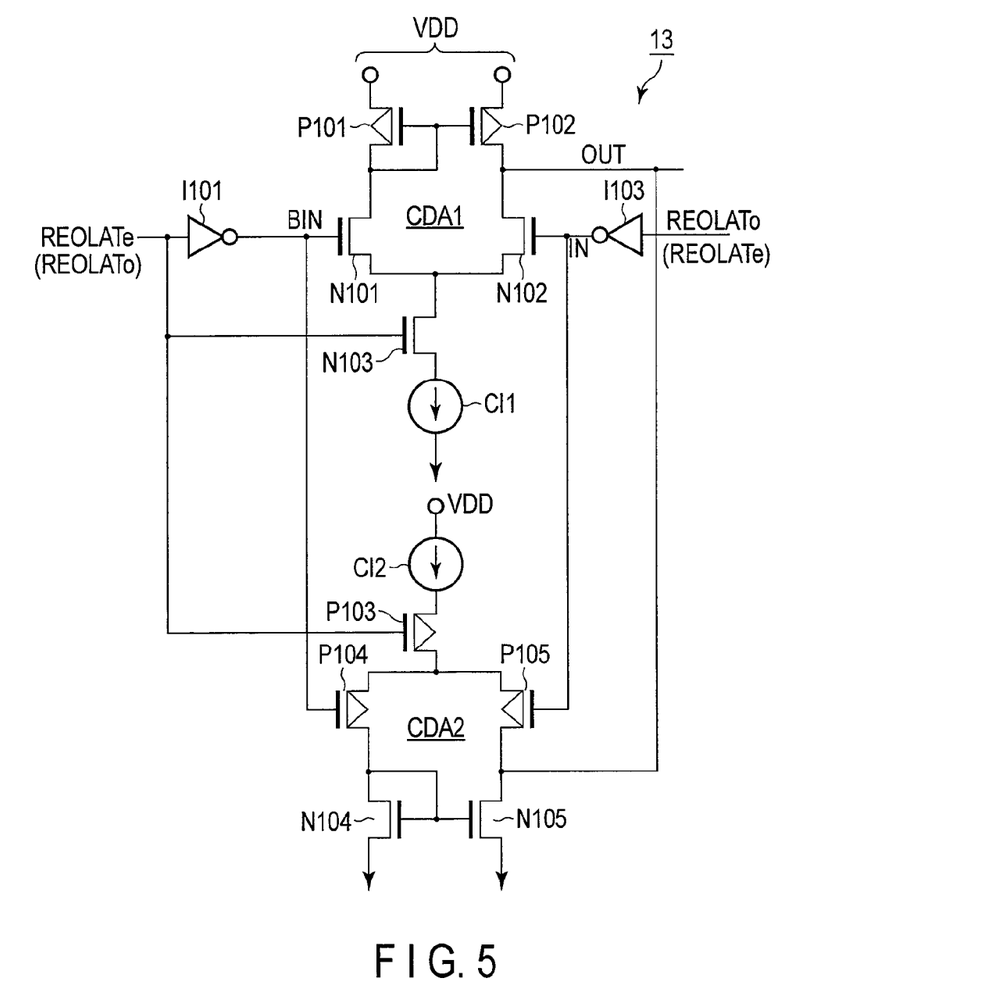
FIG. 5 is a circuit diagram showing an exemplary differential amplifier according to a third embodiment, designed for use in the first and second embodiments.

FIG. 5 shows a third embodiment.

The third and fourth differential amplifiers 13 and 14 used in the first and second embodiments are differential amplifiers in which the through current is controlled. The third and fourth differential amplifiers 13 and 14 are identical in configuration. Therefore, the configuration of only the third differential amplifier 13 will be described with reference to FIG. 5. As parenthesized in FIG. 5, the signals REOLATe and REOLATo input to the fourth differential 14 are other way around with respect to the third differential amplifier 13.

As shown in FIG. 5, the third differential amplifier 13 comprises first and second current-mirror amplifiers CDA1 and CDA2. The first and second current-mirror amplifiers CDA1 and CDA2 are configured by current-mirror type differential amplifiers. The third differential amplifier 13 has PMOS transistors P101 to P105, NMOS transistors N101 to N105, inverter circuits I101 and I103, and constant current sources CI1 and CI2.

In the first current-mirror amplifier CDA1, the current paths of PMOS transistors P101 and P102 configuring a current mirror are connected, at one end, to a node to which the power-supply voltage VDD is applied. The gates of PMOS transistors P101 and P102 are connected to the other end of the current path of PMOS transistor P101. The current paths of PMOS transistors P101 and P102 are connected, at the other end, to one end of the current path of NMOS transistor N101 and the one end of the current path of NMOS transistor N102, respectively. The current paths of NMOS transistors N101 and N102 are connected, at the other end, to ground by NMOS transistor N103 and constant current source CI1.

The first input signal (for example, clock signal REOLATe) is supplied to the gate (inverting input terminal BIN) of NMOS transistor N101 through inverter circuit I101. The second input signal (for example, clock signal REOLATo) is supplied to the gate (inverting input terminal IN) of NMOS transistor N102 through inverter circuit I103.

The first input signal is supplied also to the gate of NMOS transistor N103.

In the second current-mirror amplifier CDA2, constant current source CI2 is connected, at one end, to a node to which the power-supply voltage VDD is applied, and at the other end, to one end of the current path of PMOS transistor P103. The other end of PMOS transistor P103 is connected to one end of the current path of PMOS transistor P104 and also to one end of the current path of PMOS transistor P105. The current paths of PMOS transistors P104 and P105 are connected, at the other end, to the NNOS transistors N104 and N105 that configure a current mirror circuit, more precisely to one end of the current path of the NNOS transistor N104 and one end of the current path of NMOS transistor N105, respectively. The gates of NMOS transistors N104 and N105 are connected to one end of the current path of NMOS transistor N104. The current paths of NMOS transistors N104 and N105 are connected, at the other end, to ground.

The first input signal (for example, clock signal REOLATe) is supplied to the gate of PMOS transistor P103.

The gate of PMOS transistor P104 is connected to the inverting input terminal BIN. The gate of PMOS transistor P105 is connected to the input terminal IN.

The connection node of PMOS transistor P102 and NNOS transistor N102, and the connection node of PMOS transistor P105 and NMOS transistor N105 are connected to output terminal OUT.

In the third differential amplifier 13 so configured as described above, the first and second current-mirror amplifiers CDA1 and CDA2 operate as the first and second input signals REOLATe and REOLATo transition between high and low or low and high. The first and second current-mirror amplifiers CDA1 and CDA2 stop operating when the first and second input signals REOLATe and REOLATo finish rising or falling.

Figure 6A:
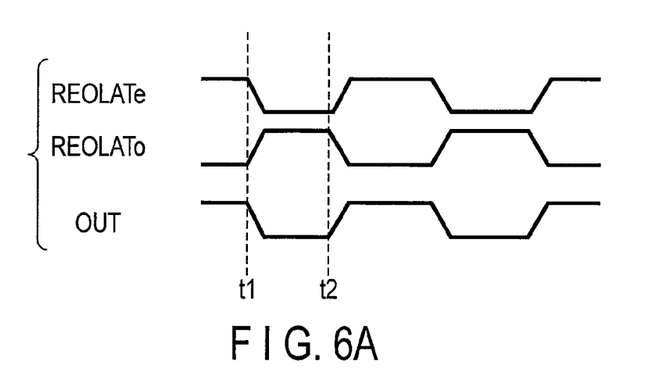
FIG. 6A and FIG. 6B are timing charts showing how the amplifier of FIG. 5 operates.

As shown in FIG. 6A, at time t1, the first input signal REOLATe goes low and the second input signal REOLATo may go high. Then, NMOS transistor N103 of the first current-mirror amplifier CDA1 is turned off. As a result, the first constant current source CI1 becomes inoperative, and PMOS transistor P103 of the second current-mirror amplifier CDA2 is turned on. The second constant current source CI2 therefore becomes operative. PMOS transistor P105 is thereby turned on, and output terminal OUT goes high. At this point, the inverting input terminal BIN stays high, and PMOS transistor P104 is off. The connection node of PMOS transistor P104 and NMOS transistor N104, which is connected to the gates of NMOS transistors N104 and N105, is therefore held at a potential equal to the threshold voltage of NMOS transistor N104. NMOS transistors N104 and 105 are therefore turned off, preventing a through current from flowing also in the second current-mirror amplifier CDA2.

At time t2, the first input signal REOLATe may go high and the second input signal REOLATo may go low. Then, NMOS transistor N103 of the first current-mirror amplifier CDA1 is turned on. Therefore, the first constant current source CI1 become operative, and PMOS transistor P103 of the second current-mirror amplifier CDA2 is thereby turned off. The second constant current source CI2 therefore becomes inoperative. At this point, the inverting input terminal BIN stays low and the non-inverting input terminal IN stays high. NMOS transistor N101 is turned off, NMOS transistor N102 is turned on, and PMOS transistor P105 is turned on. As a result, output terminal OUT is made low. The inverting input terminal BIN stays low at this point, and NMOS transistor N101 is off. Therefore, PMOS transistor P101 and the connection node of PMOS transistor P101 and NMOS transistor N101, which is connected to the gate of PMOS transistor P102 are held at a potential lower than the power-supply voltage VDD by the threshold voltage of PMOS transistor P101. PMOS transistors P101 and P102 are therefore turned off, preventing a through current from flowing also in the first current-mirror amplifier CDA1.

Figure 6B:
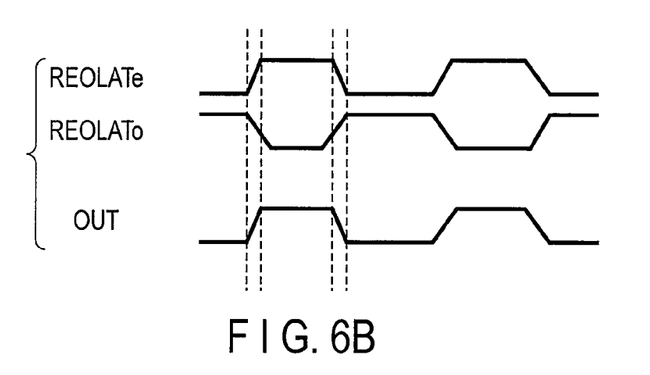

As shown in FIG. 6B, the rising and falling edges of the first input signal REOLATe may shift with respect to those of the second input signal REOLATo. Even in this case, the output potential of the first current-mirror amplifier CDA1 or second current-mirror amplifier CDA2 is determined when the first and second input signals REOLATe and REOLATo become identical in terms of level.

Therefore, through current flows in the first and second current-mirror amplifiers CDA1 and CDA2 when a potential difference is made between the first and second input signals REOLATe and REOLATo while the first and second input signals REOLATe and REOLATo are changing in terms of level. Thus, any through current is prevented from flowing in the normal state (i.e., high-impedance state).

According to the third embodiment, the first and second current-mirror amplifiers CDA1 and CDA2 have, each an NMOS transistor N103 and a PMOS transistor P103 connected in series to the first and second constant current sources CI1 and CI2, respectively, and NMOS transistor N103 and PMOS transistor P103 are controlled by the first input signal REOLATe. Therefore, the first and second constant current sources CI1 and CI2 start operating at the same time when the first input signal REOLATe transitions between low and high or high and low, and one of the first and second constant current sources CI1 and CI2 is stopped when the first input signal REOLATe goes high or goes low. The other of the first and second constant current sources CI1 and CI2 can indeed be operative. However, no tail currents flow in the other constant current source, because NMOS transistors N101 and N102 or PMOS transistors P104 and P105, configuring a differential pair, are turned off. Hence, the third differential amplifier 13 consumes current when the first input signal REOLATe goes high or low. The current consumption can therefore be achieved in the normal operating state. Thus, a through current flows in the first and second current-mirror amplifiers CDA1 and CDA2 when the first and second input signals REOLATe and REOLATo change in level, and no through currents flow in the normal state (i.e., high-impedance state).

Fourth Embodiment

Figure 7:
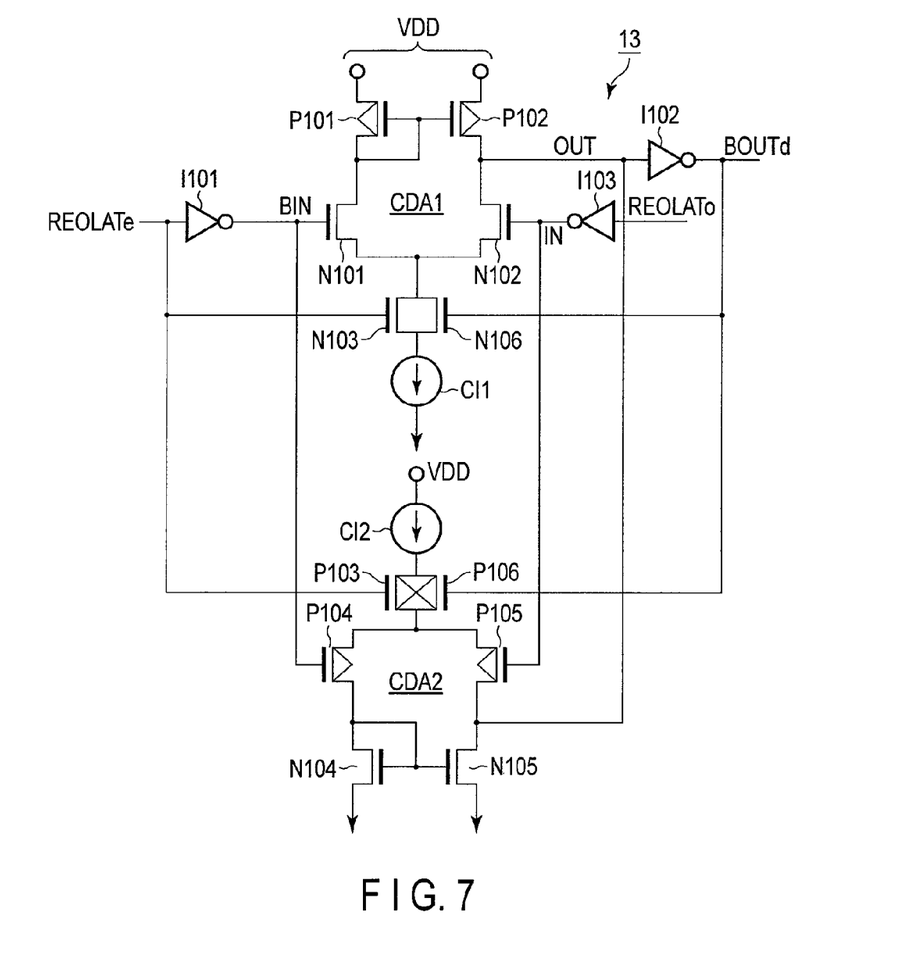
FIG. 7 is a circuit diagram showing an exemplary differential amplifier according to a fourth embodiment, designed for use in the first and second embodiments.

FIG. 7 shows a fourth embodiment. In FIG. 7, the components identical to those of the third embodiment are designated. Only the components different from those of the third embodiment will be explained below.

As shown in FIG. 7, an NMOS transistor N106 is connected in parallel to an NMOS transistor N103. PMOS transistor P103 is connected in parallel to a PMOS transistor P106. An inverter circuit I102 is connected to output terminal OUT. The signal output from inverter circuit I102 is supplied to the gate of an NMOS transistor N106 and to the gate of PMOS transistor P106.

In the fourth embodiment, the output signal is fed back to NMOS transistor N106 and PMOS transistor P106. Therefore, NMOS transistors N103 and N106 can enhance the current-driven ability of the first constant current source CI1 when the first input signal REOLATe goes high. This can improve the balance when the output signal transitions between low and high or high and low.

Further, an NMOS transistor N103 and PMOS transistors P106 can enhance the current-driven ability of the second constant current source CI2 when the first input signal REOLATe goes low. This can improve the balance when the output signal transitions between low and high or high and low.

Hence, the speed balance can be improved as the output signal transitions between high and low or low and high.

Fifth Embodiment (Differential Amplifier 17 in the Fifth Embodiment)

Figure 8:
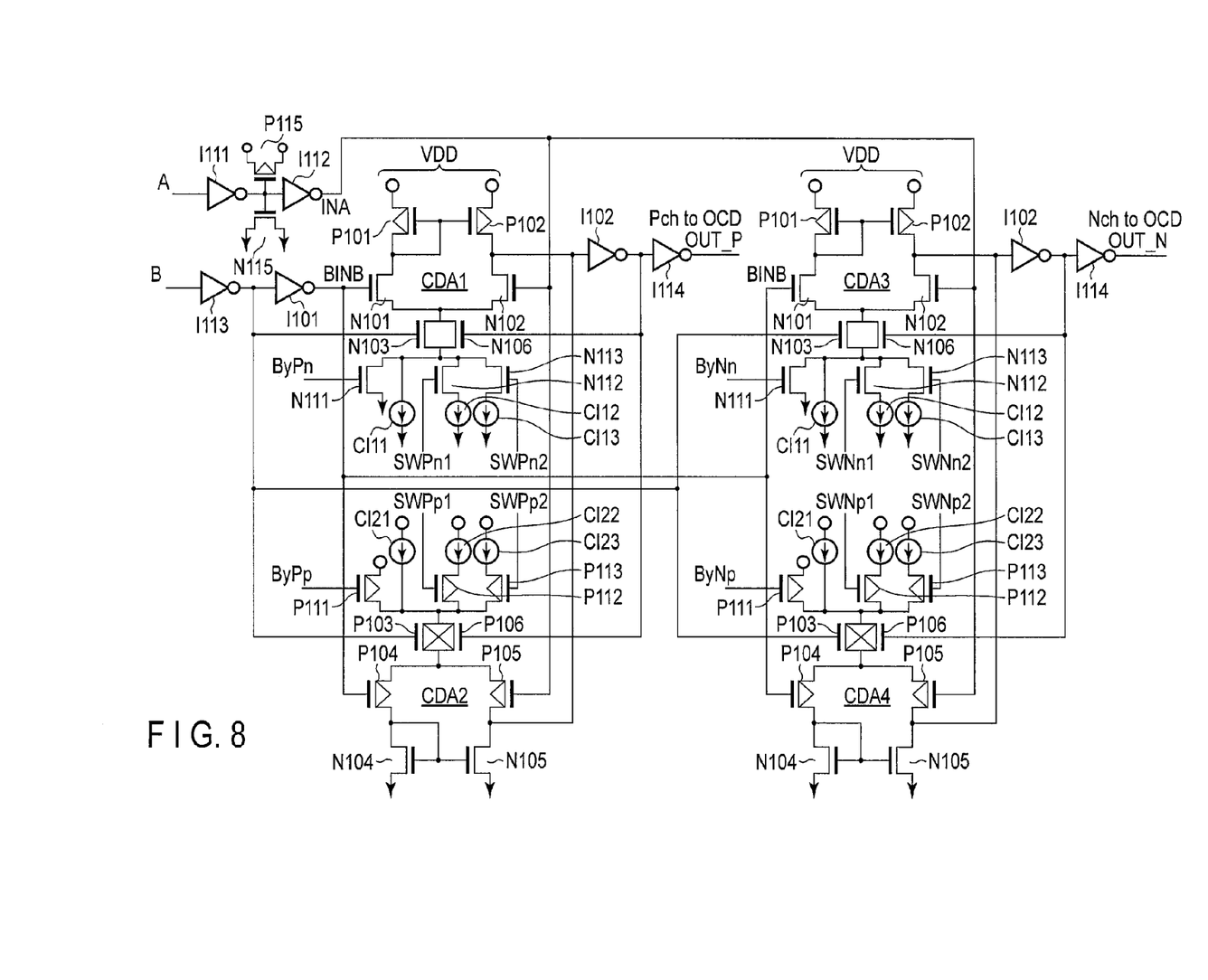
FIG. 8 is a circuit diagram showing a fifth embodiment that is a modification of the fourth embodiment.

FIG. 8 shows is a circuit diagram showing an example of the fifth differential amplifier 17. This fifth differential amplifier 17 is a modification of the third and fourth differential amplifiers 13 and 14. The fifth differential amplifier 17 differs from the differential amplifier of FIG. 7, in that its current-driven ability is variable and that it is applied to an off-chip driver (OCD) circuit. In FIG. 8, the components identical to those shown in FIG. 7 are designated by the same reference numbers. Only the components different from those shown in FIG. 7 will be explained below.

The OCD shown in FIG. 8 comprises first to fourth current-mirror amplifiers CDA1 to CDA4. The third and fourth current-mirror amplifiers CDA3 and CDA4 are identical to the first and second current-mirror amplifiers CDA1 and CDA2, except for the control signals used. Therefore, only the first and second current-mirror amplifiers CDA1 and CDA2 will be described as for configuration, and the third and fourth current-mirror amplifiers CDA3 and CDA4 will be described, as for only the components different from those of the first and second current-mirror amplifiers CDA1 and CDA2.

The circuit of FIG. 8 differs from that of FIG. 7, in that the first and second current-mirror amplifiers CDA1 and CDA2 have three constant current sources each, and that these constant current sources can be selected by using a switch.

In the first current-mirror amplifier CDA1, NMOS transistor N111, constant current source CI11, a series circuit composed of NMOS transistor N112 and constant current source CI12, and a series circuit composed of NMOS transistor N113 and constant current source CI13 are connected between ground, on one hand, and NMOS transistors N103 and N106, on the other.

A control signal ByPn is supplied to the gate of NMOS transistor N111. A control signal SWPn1 is supplied to the gate of NMOS transistor N112. A control signal SWPn2 is supplied to the gate of NMOS transistor N113.

In the second current-mirror amplifier CDA2, PMOS transistor P111, constant current source CI21, a series circuit composed of constant current source CI22 and PMOS transistor P112, and a series circuit composed of constant current source CI23 and PMOS transistor P113 are connected between the node to the node applied with the power-supply voltage VDD, on one hand, and PMOS transistors P103 and P105, on the other.

A control signal ByPp is supplied to the gate of PMOS transistor P111. A control signal SWPp1 is supplied to the gate of PMOS transistor P112. A control signal SWPp2 is supplied to the gate of PMOS transistor P113.

The third and fourth current-mirror amplifiers CDA3 and CDA4 which are configured by current-mirror type differential amplifies, differ from the first and second current-mirror amplifiers CDA1 and CDA2, in terms of control signals used.

That is, in the third current-mirror amplifier CDA3, control signal ByNn is supplied to the gate of NMOS transistor N111, control signal SWNn1 is supplied to the gate of NMOS transistor N112, and control signal SWNn2 is supplied to the gate of NMOS transistor N113.

In the fourth current-mirror amplifier CDA4, control signal ByNp is supplied to the gate of PMOS transistor P111, control signal SWNp1 is supplied to the gate of NMOS transistor P112, and control signal SWNp2 is supplied to the gate of PMOS transistor P113.

The first input signal B and the second input signal A are complementary to each other. The first input signal B is supplied via an inverter circuit I113 to the first to fourth current-mirror amplifiers CDA1 to CDA4. The second input signal A is supplied via inverter circuits I111 and I112 to the first to fourth current-mirror amplifiers CDA1 to CDA4. Between inverter circuit I111 and inverter circuit I112, the gates of NMOS transistor N115 and PMOS transistor P115 are connected. NMOS transistor N115 and PMOS transistor P115 configure a MOS capacitor. The MOS capacitor delays the second input signal A by the same time the first input signal B is delayed.

The signals output from the first and second current-mirror amplifiers CAD1 and CAD2 are supplied via an inverter circuit I114 to PMOS drive transistors (not shown). The signals output from the third and fourth current-mirror amplifiers CAD3 and CAD4 are supplied via inverter circuit I114 to NMOS drive transistors (not shown).

(Operation)

While the first to fourth current-mirror amplifiers CDA1 to CDA4 are operating, NMOS transistor N111 and PMOS transistor P111 are set to off state by control signals ByPn, ByPp, ByNn and ByNp. Constant current source CI11 and constant current source CI21 are therefore operated.

In this state, the circuit of FIG. 8 outputs signals OUT_P and OUT_N generated by inverting the input signal A.

Control signals SWPn1, SWPn2, SWPp1 and SWPp2, SWNn1, SWNn2, SWNp1 and SWNp2 may be controlled independently of each other, in response to commands. Then, the first to fourth current-mirror amplifiers CDA1 to CDA4 are independently adjusted, in terms of current driven ability. Output signal OUT_P and output signal OUT_N can therefore be adjusted independently in terms of rising and falling and high-impedance period. Hence, the duty ratio of output signal OUT_P and that of output signal OUT_N can be adjusted.

Each embodiment described above can, of course, be applied not only to NAND flash memories and DRAM-data output circuits, but also to any other semiconductor device that should operate at high speed.

Like the first and fourth embodiments, the fifth embodiment can shut a tail current while the input signal stays in normal state, thereby to reduce the current consumption.

Moreover, in the fifth embodiment, control signals SWPn1, SWPn2, SWPp1 and SWPp2, SWNn1, SWNn2, SWNp1 and SWNp2 can control the number of constant current sources (CI11 to CI13 and CI21 to CI23) driven, thereby to adjust the total current-driven ability of the first to fourth current-mirror amplifiers CDA1 to CDA4. The rising and falling and high-impedance period of output signal OUT_P and those of output signal OUT_N can therefore be adjusted, ultimately to adjust the duty ratios of output signals OUT_P and OUT_N.

Further, the duty ratio can be set nearly to 50% in the fifth embodiment. A sufficient effective-data time for which to latch data can therefore be acquired. If the fifth embodiment is applied to a DDR-data output circuit, the circuit can reliably operate at high speed.

In the third and fourth embodiments, the first and second constant current sources CI1 and CI2 may be adjusted in current-driven ability by control signals as in the fifth embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first differential amplifier configured to charge a first output terminal with a second voltage different from a first voltage, to use a first clock signal, thereby to stop the charging at the first output terminal, to receive first complementary data of the first voltage at the rising edge of a second clock signal, and to output the first complementary data at the second voltage from the first output terminal;
a second differential amplifier configured to charge a second output terminal with the second voltage, to use a third clock signal, stopping the charging at the second output terminal, to receive second complementary data of the first voltage at the rising edge of a fourth clock signal, and to output the second complementary data at the second voltage from the second output terminal.

2. The device according to claim 1, wherein the first differential amplifier has a first charging circuit configured to charge the first output terminal with the first clock signal, and the second differential amplifier circuit has a second charging circuit configured to charge the second output terminal with the third clock signal.

3. The device according to claim 2, further comprising a multiplexer connected to the output terminals of the first and second differential amplifiers and configured to hold alternately the first complementary data output from the first differential amplifier and the second complementary data output from the second differential amplifier.

4. The device according to claim 2, further comprising a multiplexer connected to the output terminals of the first and second differential amplifiers and configured to render the output terminal of the second differential amplifier non-selective with the second and fourth clock signals in order to output the first complementary data from the first differential amplifier and to render the output terminal of the first differential amplifier non-selective with the second and fourth clock signals in order to output the second complementary data from the second differential amplifier.

5. The device according to claim 2, further comprising a third differential amplifier configured to receive a fifth clock signal and a sixth clock signal complementary to the fifth clock signal, thereby to generate the second clock signal.

6. The device according to claim 5, further comprising a fourth differential amplifier configured to receive a sixth clock signal and the fifth clock signal, thereby to generate the fourth clock signal.

7. The device according to claim 5, comprising:
a first current-mirror type differential amplifier of a first conductivity type, configured to receive the fifth clock signal and the sixth clock signal;
a first constant current source;

a first transistor of a second conductivity type, connected between the first constant current source and the first current-mirror type differential amplifier and configured to receive a signal generated by inverting the fifth clock signal and a signal generated by inverting the sixth clock signal, and having an output terminal connected to the output terminal of the first current-mirror type differential;

a second current-mirror type differential amplifier configured to receive, at gate, the sixth clock signal;

a second constant current source; and a second transistor of the first conductivity type, connected between the second constant current source and the second current-mirror type differential amplifier and configured to receive, at gate, the fifth clock signal.

8. The device according to claim 7, further comprising:

a third transistor of the second conductivity type, connected in parallel to the first transistor to receive, at gate, a signal generated by inverting the signal output from the output terminal; and a fourth transistor of the first conductivity type, connected in parallel to the second transistor to receive, at gate, a signal generated by inverting the signal output from the output terminal.

9. The device according to claim 8, wherein the first and second constant current sources are adjusted by a control signal in terms of current-driven ability.

10. The device according to claim 3, further comprising a fifth differential amplifier connected to the output terminals of the third and fourth differential amplifiers and including six and seventh differential amplifiers, the sixth differential amplifier configured to output a third output signal from a fifth output terminal in accordance with first and second output signals, and the seventh differential amplifier configured to output the third output signal from a sixth output terminal in accordance with first and second output signals.

11. The device according to claim 10, wherein the sixth differential amplifier comprises:

a third current-mirror type differential amplifier of a first conductivity type configured to receive the first and second output signals and having a fifth output terminal for outputting the third output signal;

a fifth transistor of a second conductivity type connected to the third current-mirror type differential amplifier and configured to receive, at gate, the first output signal inverted;

a plurality of third constant current sources;

a plurality of sixth transistors of the second conductivity to be selected in accordance with a first control signal, the sixth transistors connected between the fifth transistor and the plurality of third constant current sources;

a plurality of fourth constant current sources;

a fourth current-mirror type of the second conductivity type, configured to receive the first and second output signals and connected, at output terminal, to the fifth output terminal;

a seventh transistor of the first conductivity type connected to the fourth current-mirror type differential amplifier and configured to receive, at gate, the first output signal inverted; and a plurality of eighth transistors of the first conductivity type to be selected in accordance with a second control signal, the eighth transistors connected between the seven transistor and the plurality of fourth constant current sources, and the seventh differential amplifier comprises:

a seventh current-mirror type differential amplifier of the first conductivity type configured to receive fifth and sixth input signals and having a sixth output terminal;

a ninth transistor of the second conductivity type connected to the seventh current-mirror type differential amplifier, to receive, at gate, the fifth clock signal inverted;

a fifth constant current source;

a plurality of tenth transistors of the second conductivity type to be selected in accordance a third control signal, the tenth transistors connected between the ninth transistor and the plurality of fifth constant current sources;

a plurality of sixth constant current sources;

an eighth current-mirror type differential amplifier configured to receive the first and second output signals and having an output terminal to the sixth output terminal;

an eleventh transistor of the first conductivity type connected to the eighth current-mirror type differential amplifier, to receive, at gate, the fifth clock signal; and a twelfth transistor of the first conductivity type to be selected by a fourth control signal, the twelfth transistor connected between the eleventh transistor and the plurality of sixth constant current sources.

12. The device according to claim 6, further comprising a level converter configured to receive the first and fourth clock signals output from the third and fourth differential amplifies, respectively, and to generate the first and second clock signals.

* * * * *